United States Patent
Boulmay et al.

(10) Patent No.: US 11,894,215 B2
(45) Date of Patent: Feb. 6, 2024

(54) METHOD FOR STRUCTURING A DECORATIVE OF TECHNICAL PATTERN IN AN OBJECT MADE OF AN AT LEAST PARTIALLY TRANSPARENT AMORPHOUS, SEMI-CRYSTALLINE OR CRYSTALLINE MATERIAL

(71) Applicant: Comadur S.A., Le Locle (CH)

(72) Inventors: Alexis Boulmay, Morteau (FR); Pierry Vuille, Les Emibois (CH); Julien Meier, Neuchatel (CH); Pierpasquale Tortora, Neuchatel (CH)

(73) Assignee: Comadur S.A., Le Locle (CH)

( * ) Notice: Subject to any disclaimer, the term of this patent is extended or adjusted under 35 U.S.C. 154(b) by 0 days.

(21) Appl. No.: 17/384,375

(22) Filed: Jul. 23, 2021

(65) Prior Publication Data

US 2021/0351002 A1 Nov. 11, 2021

Related U.S. Application Data

(63) Continuation of application No. 16/364,654, filed on Mar. 26, 2019, now Pat. No. 11,302,515.

(30) Foreign Application Priority Data

Apr. 19, 2018 (EP) ..................................... 18168168

(51) Int. Cl.
*H01J 37/305* (2006.01)
*G04B 19/06* (2006.01)
(Continued)

(52) U.S. Cl.
CPC .......... *H01J 37/3053* (2013.01); *G04B 19/06* (2013.01); *G04B 29/022* (2013.01);
(Continued)

(58) Field of Classification Search
CPC .. H01J 37/08; H01J 37/3053; G04B 37/0008; G04B 29/022; G04B 39/022; G04B 19/06
See application file for complete search history.

(56) References Cited

U.S. PATENT DOCUMENTS 5,066,514 A * 11/1991 Oyoshi ............... C03C 23/0055
427/527
11,302,515 B2 * 4/2022 Boulmay ............ C03C 23/0025
(Continued)

FOREIGN PATENT DOCUMENTS

CN 101103319 A 1/2008
CN 102842497 A 12/2012
(Continued)

OTHER PUBLICATIONS

Wikipedia, "Polyethylene terephthalate" via https://web.archive.org/web/20180910145333/https://en.wikipedia.org/wiki/Polyethylene_terephthalate ; pp. 1-17 (Year: 2018).*
(Continued)

*Primary Examiner* — Binh X Tran
(74) *Attorney, Agent, or Firm* — Oblon, McClelland, Maier & Neustadt, L.L.P.

(57) ABSTRACT

A method for structuring a decorative or technical pattern in the thickness of an object made of an at least partially transparent amorphous, semi-crystalline or crystalline material, wherein the object is made of an at least partially transparent material including a top surface and a bottom surface which extends away from the top surface. The top or bottom surfaces is provided with a mask defining an opening whose outline corresponds to the profile of the pattern to be structured, the mask covering the top or bottom surface at the positions which are not to be structured. The pattern is structured with a mono- or multicharged ion beam through the opening of the mask, wherein the mechanical properties of the mask are sufficient to prevent the ions of the ion beam
(Continued)

from etching the top or bottom surface at the positions where this top or bottom surface is covered by the mask.

12 Claims, 4 Drawing Sheets

(51) Int. Cl.
  *G04B 29/02* (2006.01)
  *G04B 37/00* (2006.01)
  *G04B 39/00* (2006.01)
  *H01J 37/08* (2006.01)

(52) U.S. Cl.
  CPC ....... *G04B 37/0008* (2013.01); *G04B 39/002* (2013.01); *H01J 37/08* (2013.01); *H01J 2237/08* (2013.01)

(56) References Cited

U.S. PATENT DOCUMENTS

| | | |
|---|---|---|
| 2004/0161708 A1 | 8/2004 | Nagase et al. |
| 2006/0128165 A1* | 6/2006 | Theiss ................... G03F 7/2014 438/798 |
| 2011/0227198 A1 | 9/2011 | Wunderer |
| 2012/0168768 A1* | 7/2012 | Fang ................... H01L 21/0242 438/34 |
| 2013/0342910 A1 | 12/2013 | Schaur et al. |
| 2017/0107641 A1* | 4/2017 | Busardo .............. C23C 14/0015 |
| 2017/0233889 A1* | 8/2017 | Nishibayashi .......... C23C 16/56 428/155 |
| 2017/0345655 A1 | 11/2017 | Posseme et al. |
| 2018/0222766 A1* | 8/2018 | Roqan ............... H01L 21/02631 |
| 2018/0252844 A1* | 9/2018 | Loncar ................... B82Y 20/00 |
| 2019/0352763 A1* | 11/2019 | Vuille .................... G02B 1/113 |

FOREIGN PATENT DOCUMENTS

| | | |
|---|---|---|
| EP | 0 991 337 A1 | 4/2000 |
| EP | 3 249 468 A1 | 11/2017 |
| FR | 2 962 136 A1 | 1/2012 |
| WO | 99/55188 A1 | 11/1999 |

OTHER PUBLICATIONS

Korean Office Action issued in Korean Patent Application No. 10-2019-0043201 dated Mar. 15, 2021 (w/ English Translation).
Combined Taiwanese Office Action and Search Report issued in Taiwanese Patent Application No. 108108049 dated Dec. 30, 2020 (English Translation only).
Combined Chinese Office Action and Search Report issued in Chinese Patent Application No. 201910307739.X dated Oct. 28, 2020 (w/ English translation).
Japanese Office Action issued in Japanese Patent Application No. 2019-049355 dated Nov. 10, 2020 (w/ English translation).
European Search Report in European Application 18168168.5 dated Oct. 17, 2018 (w/ English translation of categories of Cited Documents).
Kiyohara et al. "Reactive Ion Beam machining of diamond using ECR-type oxygen source", Nanotechnology 7, (1996).
Wikipedia, Poly(methyl methacrylate) via https://en.wikipedia.org/wiki/Poly(methyl_methacrylate), (2020).
Wikipedia, Polyethylene terephathalate via https://en.wikipedia.org/wiki/Polyethylene_terephthalate, (2020).

* cited by examiner

METHOD FOR STRUCTURING A DECORATIVE OF TECHNICAL PATTERN IN AN OBJECT MADE OF AN AT LEAST PARTIALLY TRANSPARENT AMORPHOUS, SEMI-CRYSTALLINE OR CRYSTALLINE MATERIAL

CROSS-REFERENCE TO RELATED APPLICATIONS (SAMPLE PARAGRAPH)

This application is a continuation of U.S. application Ser. No. 16/364,654 filed Mar. 26, 2019, which claims the benefit of priority to European Application No. 18168168.5 filed Apr. 19, 2018, the entire contents of each of which are incorporated herein by reference.

TECHNICAL FIELD OF THE INVENTION

The present invention relates to a method for structuring a decorative or technical pattern in the thickness of an object made of an at least partially transparent amorphous, semi-crystalline or crystalline material. The present invention relates more particularly to a structuring method using a mono- or multicharged ion beam.

TECHNOLOGICAL BACKGROUND OF THE INVENTION

Engraving a decorative pattern by means of a laser beam in the thickness of an object made of an amorphous or crystalline material is known. For this, a powerful laser whose beam will be focused by means of a lens so as to create a series of points at the desired positions inside the transparent object is used. The lens makes it possible to concentrate the coherent light from the laser on a very small surface, which makes it possible to attain optical power values which exceed the damage threshold and which are sufficient to create microcracks in the transparent object. These microcracks of typically 50 to 150 micrometres in size correspond to the positions where the laser beam has been focused and where the material has melted under the effect of the addition of heat. These microcracks act as scattering centres of the ambient light, which makes it possible to reveal them to the observers view. It is thus possible to engrave in the thickness of an object made of a transparent material a network of points which will form a two-dimensional pattern. In order to carry out three-dimensional engraving, it is possible to overlay a plurality of two-dimensional point network so precisely that the resulting pattern gives the impression of having been engraved from a single block.

The advantage of the technique briefly described above is that of making it possible to produce two- or three-dimensional patterns in an object made of a transparent material such as an object made of glass or an object made of polymethyl methacrylate (PMMA). These patterns may have a technical function or an aesthetical function. In the field of consumer products, objects made of a transparent material are particularly known wherein, based on a digital file of a photograph, the reproduction of a person's face is engraved, for example. Such products meet certain success with consumers. One of the main drawbacks of this engraving technique is nevertheless the frequently long time required to engrave the patterns in the object made of a transparent material which renders the use thereof in the industrial field problematic.

SUMMARY OF THE INVENTION

The aim of the present invention is that of remedying the problems mentioned above along with others by providing a method for structuring a pattern in the thickness of an object made of an at least partially transparent material which is particularly rapid and readily automatable.

To this end, the present invention relates to a method for structuring a decorative or technical pattern in the thickness of an object made of an at least partially transparent amorphous, semi-crystalline or crystalline material, the object made of an at least partially transparent material comprising a top surface and a bottom surface which extends away from the top surface, the method comprising the step consisting of providing at least one of the top or bottom surfaces of the object made of an at least partially transparent material with a mask which defines at least one opening the outline thereof corresponding to the profile of the decorative or technical pattern to be structured, the mask covering the at least one top or bottom surface of the object made of an at least partially transparent material at the positions which are not to be structured, the method also comprising the step which consists of structuring the decorative or technical pattern by means of a mono- or multicharged ion beam through the at least one opening of the mask, the mechanical properties of the mask being sufficient to prevent the ions of the ion beam from etching the at least one top or bottom surface of the object made of an at least partially transparent material at the positions where this surface is covered by the mask.

According to one particular embodiment of the method according to the invention, the mono- or multicharged ion beam is produced by a mono- or multicharged ion source of the electron cyclotron resonance (ECR) type.

According to a further particular embodiment of the method according to the invention, the at least partially transparent object is made of sapphire, ruby or diamond, preferably synthetic.

According to an even further particular embodiment of the method according to the invention, the at least partially transparent object is made of a semi-crystalline organic material.

According to an even further particular embodiment of the method according to the invention, the at least partially transparent object is made of mineral glass or of an amorphous organic material.

According to an even further particular embodiment of the method according to the invention, the mask is deposited on at least one of the top and bottom surfaces of the object made of an at least partially transparent material:
  either by selective deposition such as ink-jet printing of a masking material at the positions where the mask is to cover that of the top and/or bottom surfaces whereon it is structured;
  or by deposition of a layer of a masking material on the entirety of that of the top and/or bottom surfaces whereon the mask is to be structured, followed by ablation of the masking layer at the positions where that of the top and/or bottom surface is to be structured.

According to an even further particular embodiment of the method according to the invention, the masking layer is ablated by means of a laser beam.

According to an even further particular embodiment of the method according to the invention, the masking layer is an ultraviolet radiation-sensitive resin which is structured by means of a UV source.

The present invention also relates to an object made of an at least partially transparent amorphous, semi-crystalline or crystalline material in accordance with the method according to the invention. This object may particularly be a glass, a dial or a bezel for a timepiece such as a wristwatch, a middle or a back of a case, a winding-mechanism crown or a push-button head for a timepiece movement, a wristlet link for a watch or a piece of jewelry or indeed a bridge for a timepiece movement.

The present invention also relates to a portable object, particularly a watchcase, comprising at least one element chosen in the group formed by a glass, a dial, a bridge and a back, this at least one element being made of an at least partially transparent amorphous, semi-crystalline or crystalline material and structured in accordance with the method according to the invention, this element comprising at least one top surface and at least one bottom surface interconnected by an edge, the portable object also comprising a light source, the light source being arranged so as to illuminate the element via the bottom surface thereof or via the edge thereof.

Owing to these features, the present invention provides a method for selectively structuring a three-dimensional technical or decorative pattern in an object made of an at least partially transparent material by means of a mono- or multicharged ion beam. According to the invention, the term mono-charged ions denotes ions whose degree of ionisation is equal to +1, and the term multicharged ions denotes ions whose degree of ionisation is greater than +1. The ion beam may comprise ions all having the same degree of ionisation, or may result from a mixture of ions having different degrees of ionisation.

By bombarding through a mask a surface of an object made of an at least partially transparent material by means of an ion beam, it is possible to structure in this object a three-dimensional technical or decorative pattern from the surface and up to a certain depth. Indeed, on striking the object made of an at least partially transparent material, the ions of the ion beam penetrate the object and create cavity or void type defects from a very short distance from the surface of this object, typically of the order of 10 to 15 nanometres, and up to a depth typically between 200 and 500 nanometres.

In a first aspect, if one considers that the defects created by the ions in the object made of an at least partially transparent material are of substantially cubic shape, the length of one side of such a cube is typically of the order of 50 to 200 nanometres. Obviously, the size of the defects created and the depth up to which such defects are created are particularly dependent on the nature of the material of which the object is made, the degree of ionisation of the ions and the velocity with which the ions strike the surface of the object. It is also understood that the size of the defects created in the object decreases from the surface towards the inside of this object. Analyses performed particularly by transmission electron microscopy show that an object made of an at least partially transparent material structured by means of an ion beam in accordance with the method according to the invention exhibits, from the surface towards the inside, a very thin surface layer, of the order of 10 to 15 nanometres, devoid of defects, followed by an amorphous structural layer whose thickness is between 100 and 500 nanometres and wherein defects are formed. Beyond this amorphous structural layer, practically no further effect of the ion bombardment on the structure of the material of which the object is made is observed.

Among the known ion implantation techniques, one of these consists of bombarding the surface of the object to be treated by means of a mono- or multicharged ion source of the electron cyclotron resonance type. Such a system is also known as Electron Cyclotron Resonance or ECR.

An ECR ion source makes use of electron cyclotron resonance to create a plasma. Microwaves are injected into a low-pressure gas volume to be ionised, at a frequency corresponding to the electron cyclotron resonance defined by a magnetic field applied to a region situated inside the gas volume to be ionised. The microwaves heat the free electrons present in the gas volume to be ionised. These free electrons, under the effect of thermal agitation, will come into collision with the atoms or molecules and induce the ionisation thereof. The ions produced correspond to the type of gas used. This gas may be pure or composite. It may also consist of a vapour obtained from a solid or liquid material. The ECR ion source is capable of producing singly charged ions, i.e. ions whose degree of ionisation is equal to 1, or indeed multicharged ions, i.e. ions whose degree of ionisation is greater than 1.

BRIEF DESCRIPTION OF THE FIGURES

Further features and advantages of the present invention will emerge more clearly from the following detailed description of an example of embodiment of the method according to the invention, this example being given merely by way of illustration and not restriction with reference to the appended drawing wherein.

DETAILED DESCRIPTION OF AN EMBODIMENT OF THE INVENTION

The present invention proceeds from the general inventive idea which consists of selectively bombarding the surface of an object made of an at least partially transparent material through a mask using a mono- or multicharged ion beam to create in this object a three-dimensional technical or decorative pattern. The term mono- or multicharged ion beam denotes a beam comprising ions accelerated under the effect of an electric field and exhibiting either all the same degree of ionisation, or exhibiting different degrees of ionisation. The ions strike the surface of the object and penetrate therein up to a certain depth, creating cavity or void type defects, the properties thereof, particularly optical, being different to those of the material which is not affected by the ion bombardment. It is understood that the depth up to which the ions penetrate the object and the dimensions of the defects created are dependent on multiple factors of which mention may be made of the nature of the material of which the at least partially transparent object is made, the mass of the ions, the degree of ionisation of the ions or indeed the velocity at which the ions strike the surface of the object. It is also understood that the features of these defects, namely the dimensions thereof and the depth at which they are found below the surface of the object, determine the physical, particularly optical, properties thereof. In some cases indeed, the three-dimensional technical or decorative pattern structured in the object made of an at least partially transparent material in accordance with the method according to the invention is not perceptible under normal conditions of use, and the presence thereof may only be revealed if the user makes use of the hydrophilic properties of the pattern by spraying a little steam on the surface of the object wherein the pattern has been structured. In other cases, the defects which form the desired technical or decorative pattern act as light scattering centres, such that the pattern is perceptible even under normal brightness conditions, and stands out even more clearly when the object in which this pattern has been structured is illuminated by means of a light source.

Figure 1:
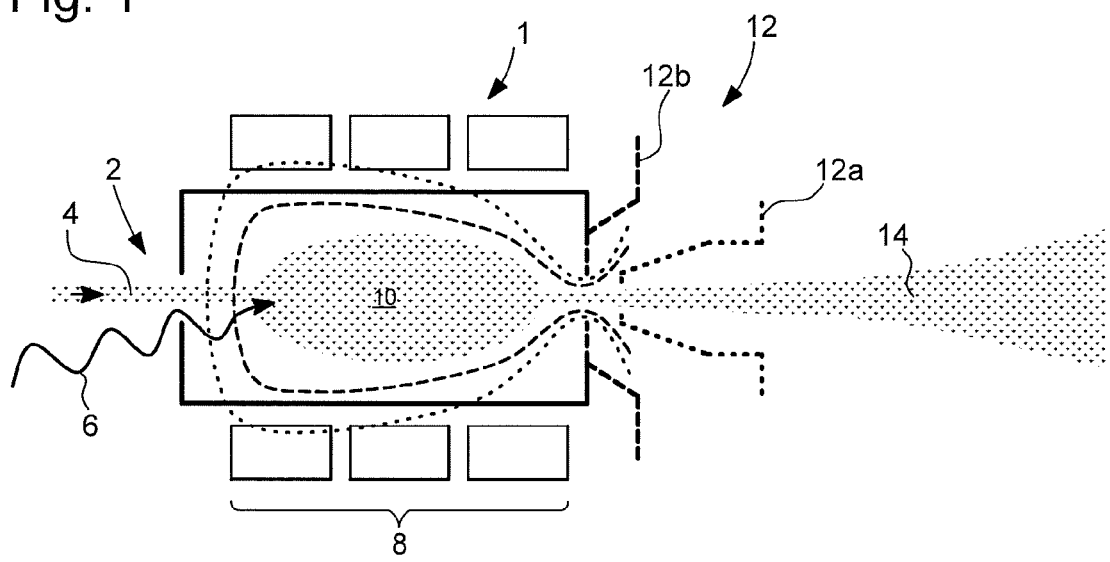
FIG. 1 is a schematic view of a mono- or multicharged ion source of the ECR electron cyclotron resonance type according to the prior art.

A number of ion implantation techniques exist. Within the scope of the present patent application, particular interest is taken in a mono- or multicharged ion source of the ECR electron cyclotron resonance type. Very schematically, and as illustrated in FIG. 1 appended to the present patent application, an ECR ion source, designated as a whole by the general reference number 1, comprises an injection stage 2 in which a volume 4 of gas to be ionised and a microwave 6 are introduced, a magnetic confinement stage 8 in which a plasma 10 is created, and an extraction stage 12 for extracting and accelerating the ions of the plasma 10 by means of an anode 12a and a cathode 12b between which a high voltage is applied. At the output thereof, the ECR ion source 1 produces an ion beam 14 which, according to requirements, may comprise ions all exhibiting the same degree of ionisation, or indeed will result from a mixture of ions exhibiting different degrees of ionisation. In a first aspect, the ion acceleration voltage is between 1 kV and 1000 kV and the implantation dose is between $1.10^{15}$ ions·cm$^{-2}$ and $10^{18}$ ions·cm$^{-2}$.

Figure 2A:
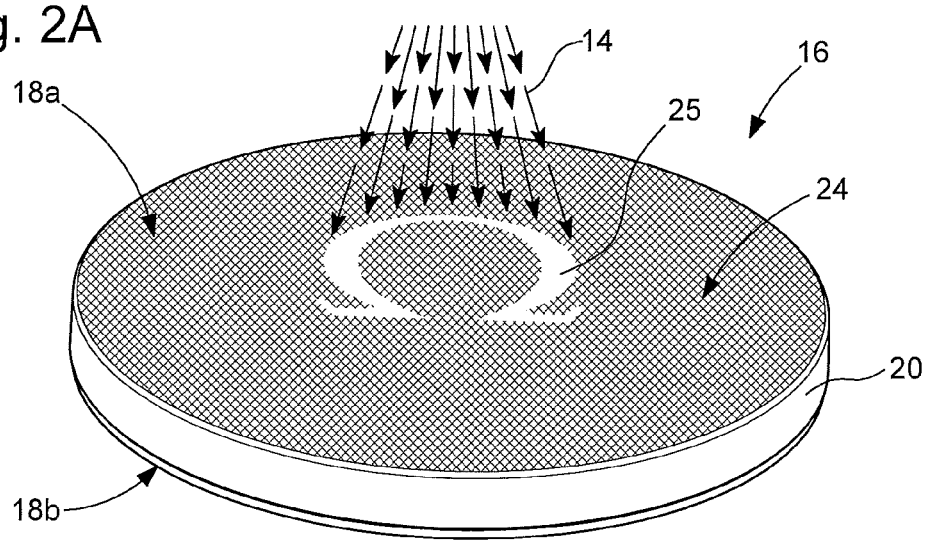
FIGS. 2A and 2B are perspective views illustrating the steps of the method according to the invention for structuring by means of a multicharged ion beam a decorative pattern in a surface of an object made of an at least partially transparent material.
Figure 2B:
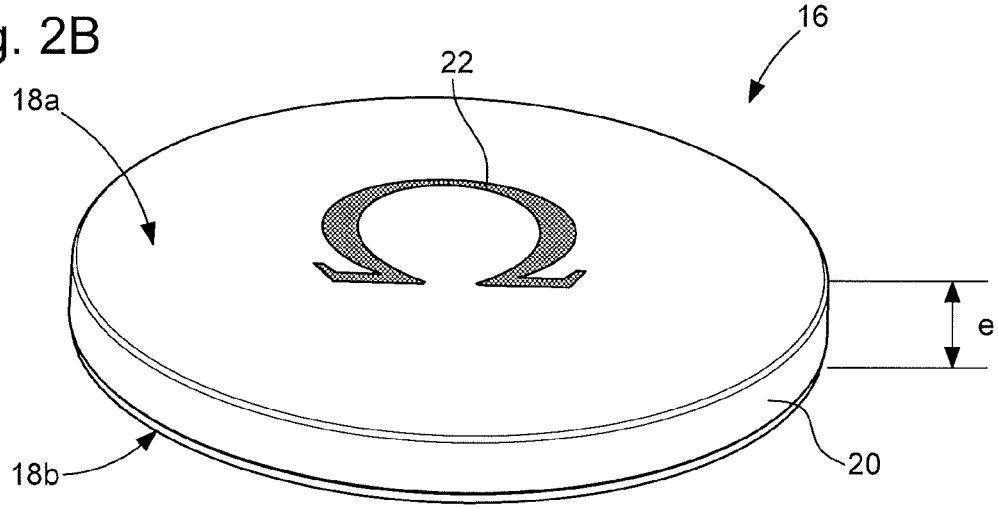

An example of an object made of a crystalline transparent material and in which a decorative pattern is produced in accordance with the method according to the invention is illustrated in FIGS. 2A and 2B. Designated overall by the general reference number 16, this object is a glass made of sapphire and intended to close a watchcase from the top. This glass 16 comprises a top surface 18a and a bottom surface 18b which extends away from the top surface 18a and which is connected to the latter along the rim thereof by an edge 20. In the example illustrated in FIGS. 2A and 2B, it has been chosen to structure a decorative pattern 22, in this instance the letter of the Greek alphabet Ω, in the top surface 18a of the glass 16. Obviously, this example is given merely by way of illustration and not restriction, it being understood that it would be possible to structure a pattern in the bottom surface 18b of the glass 16, or even structure a decorative pattern in each of the top 18a and bottom 18b surfaces of the glass 16.

Merely by way of example, the sapphire glass 16 which has been treated in accordance with the method according to the invention is planar. The top 18a and bottom 18b surfaces thereof extend parallel with each other separated by a thickness e=2 mm. After masking the top surface 18a of the glass 16 by means of a mask 24 so as to define an opening 25 the outline thereof corresponding to the desired decorative pattern 22, the glass 16 is bombarded by means of an ion beam 14 consisting of nitrogen ions having a degree of ionisation +1 to +3. The ion beam 14 is produced by means of an ECR ion source 1 of the type described above with reference to FIG. 1. The ion acceleration voltage used is 37.5 kV and the ion implantation dose is $0.5*10^{16}$ ions·cm$^{-2}$. It is observed that, under the experimental conditions detailed hereinabove, the decorative pattern 22 is imperceptible under natural ambient brightness conditions, and the presence thereof may only be revealed if the user blows steam towards the top surface 18a of the glass 16. In the Applicant's opinion, this phenomenon is explained in that the zone of the glass 16 in which is structured the decorative pattern 22 exhibits hydrophilic behaviour. Thus, when the steam falls on the top surface 18a of the glass 16, a thinner layer of water with a lower surface tension is formed in the hydrophilic zone where the decorative pattern 22 has been structured than on the rest of the top surface 18a. The layer of water at the position where the decorative pattern 22 has been structured is therefore optically less diffusive and therefore becomes perceptible by the user.

A second example of embodiment of the method according to the invention is provided with reference to an identical glass 16 to that described above. The decorative pattern 22 structured in the top surface 18a of the glass 16 is also unchanged, only the ion bombardment parameters being modified. In this instance, the glass 16 is bombarded by means of an ion beam 14 consisting of nitrogen ions having a degree of ionisation +1 to +3. The ion beam 14 is produced by means of an ECR ion source 1 of the type described above with reference to FIG. 1. The ion acceleration voltage used is 37.5 kV and the ion implantation dose is $1.10^{17}$ ions·cm$^{-2}$. It is observed that, under the experimental conditions detailed hereinabove, the decorative pattern 22 structured in the glass 16 is visible to the naked eye in daylight, and stands out even more clearly when the glass 16 wherein this decorative pattern 22 has been structured is illuminated by means of a light source. It is understood that the defects forming the decorative pattern 22 act as light scattering centres, such that the decorative pattern 22 is perceptible even under normal brightness conditions.

In the two examples detailed above, it is seen that using the same ions and accelerating them with the same voltage, it is possible, by varying only the implanted ion dose, to modify the physical, particularly optical, properties of the decorative pattern 22 obtained. Indeed, with an ion implantation dose of $0.5*10^{16}$ ions·cm$^{-2}$, the decorative pattern 22 is imperceptible to the naked eye under normal lighting conditions, and the presence thereof is revealed by spraying steam to make use of the hydrophilic properties thereof. In the second case, the ion implantation dose is $1*10^{17}$ ions·cm$^{-2}$ and makes it possible to create in the glass 16 defects which act as light scattering centres, rendering the decorative pattern 22 perceptible even in daylight. These differences in physical behaviour of the pattern structured in the object made of an at least partially transparent material are explained in that the defects which appear in the object under the effect of the ion bombardment differ by the dimensions thereof and by the concentration thereof per unit of volume.

Figure 3:
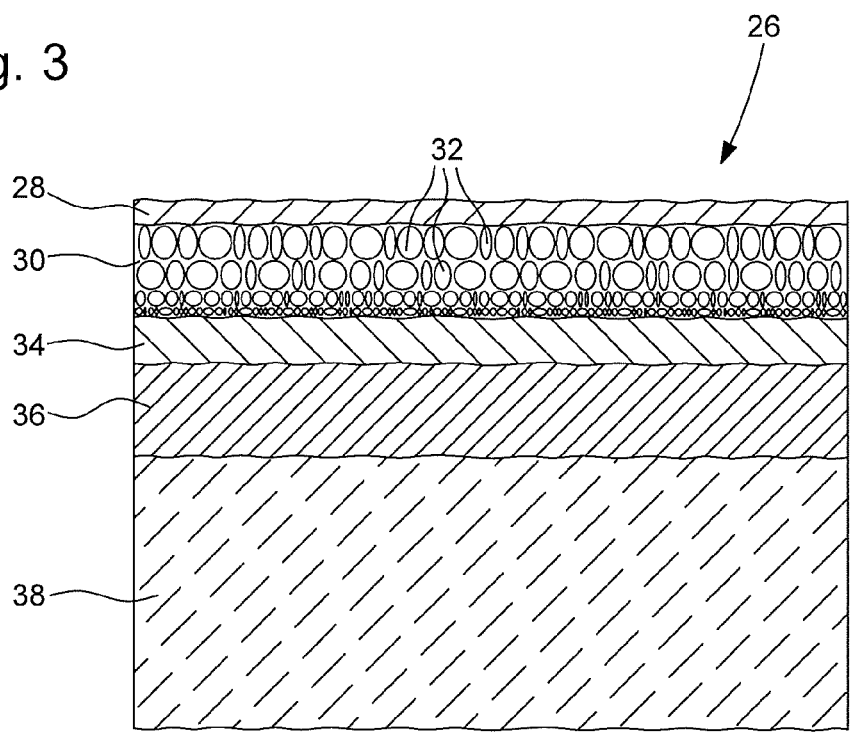
FIG. 3 is a sectional view through the thickness of an object made of sapphire bombarded by means of a nitrogen ion beam.

FIG. 3 is a sectional view in the thickness of a sapphire sample 26 bombarded by means of a nitrogen ion beam. On examining this figure, it is observed that the sapphire sample 26 exhibits, from the surface inwards, the following series of layers:

firstly a very thin, surface layer 28, typically of the order of 7 to 15 nanometres which, surprisingly, is slightly or not affected by the ion bombardment and retains the crystalline structure thereof. An attempt to explain this phenomenon is that, when the nitrogen ions strike the surface of the sapphire sample 26, the nitrogen ions penetrate the sapphire sample 26 taking the lowest-energy path and pass through the cells of the crystallographic silicon structure.

then, a first amorphous layer 30 the thickness thereof being typically between 50 and 60 nanometres. This first amorphous layer 30 is characterised by cavities 32 the dimensions thereof decreasing as the nitrogen ions penetrate more deeply into the thickness of the sapphire sample 26. This phenomenon is explained in that the deeper the nitrogen ions penetrate into the thickness of the sapphire sample 26, the lower the velocity thereof and the less damage caused to the crystallographic structure of the sapphire sample 26.

then, a second amorphous layer 34 devoid of cavities the thickness thereof being of the order of 20 to 30 nanometres. The crystallographic structure of the sapphire is therefore highly disrupted by the ion bombardment up to a depth of approximately 80 to 100 nm under the surface of the sapphire sample 26.

finally, a final layer 36 of a thickness of the order of 50 to 60 nanometres the crystallinity thereof being disturbed without however the sapphire being rendered amorphous throughout the volume thereof.

beyond this final layer 36, the sapphire in the volume 38 is found.

Figure 4:
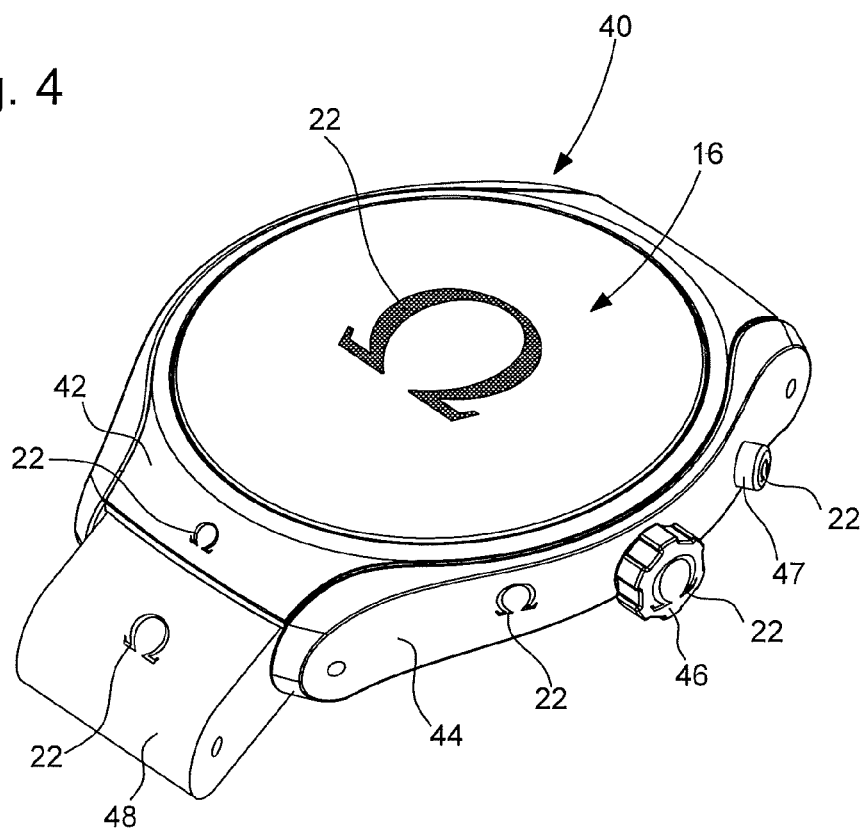
FIG. 4 is a perspective view of a watchcase in various elements whereof are embodied decorative patterns according to the teachings of the method according to the invention.

In FIG. 4, a watchcase 40 has been represented merely by way of example some components thereof having been treated in accordance with the method according to the invention. They consist of a bezel 42, a middle 44, a crown 46, a corrector 47 and a wristlet link 48. These various elements are embodied in accordance with the method according to the invention by means of an object made of an at least partially transparent material wherein the structure is crystalline, semi-crystalline or indeed amorphous and wherein the decorative pattern 22 is engraved by means of a mono- or multicharged ion beam.

Figure 5A:
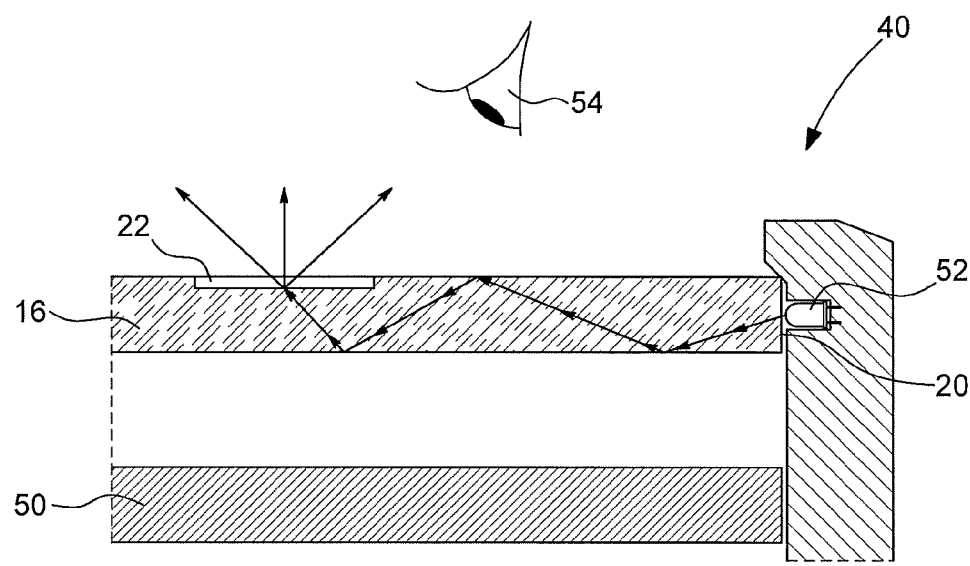
FIGS. 5A and 5B illustrate two different embodiments of illumination of a decorative pattern in the top surface of a watch glass in accordance with the method according to the invention.
Figure 5B:
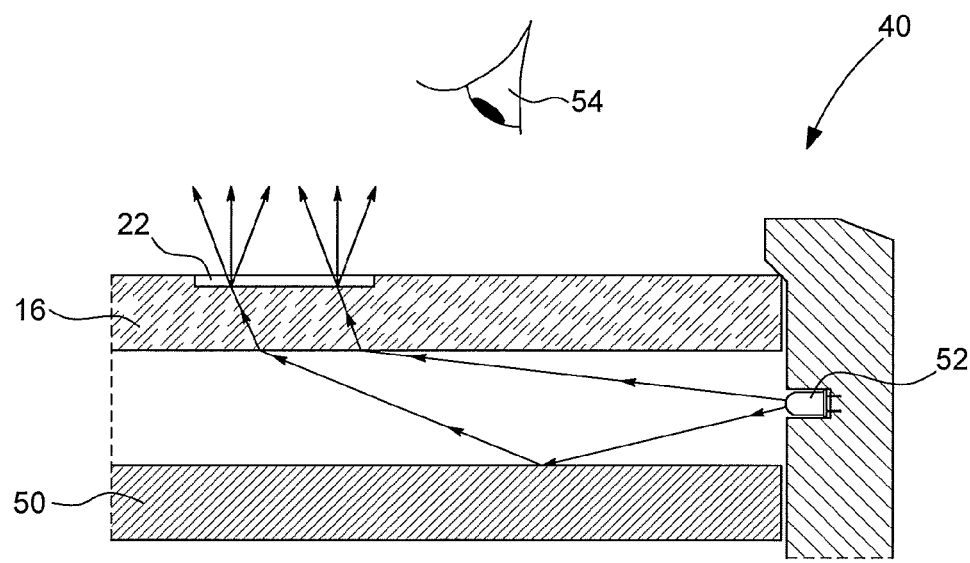

The glass 16 equipped with the decorative pattern 22 thereof described above extends on top of a dial 50 and closes from the top the case 40 (see FIGS. 5A and 5B). This is the alternative embodiment wherein the defects created by ion bombardment form a decorative pattern 22 which scatters light. To enhance this decorative pattern 22 further, it is envisaged to illuminate the glass 16 by means of a light source 52. This light source 52 may be arranged facing the edge 20 of the glass 16. The light produced by the light source 52 thus penetrates into the thickness of the glass 16 and a portion is extracted from the glass 16 upwards towards the observer 54 scattered by the defects which form the decorative pattern 22, rendering the decorative pattern 22 luminous and very visible. The light source 52 may also be arranged between the dial 50 and the glass 16. The light produced by the light source 52 penetrates the glass 16 either directly, or by being reflected firstly onto the dial 50, then is partially scattered towards the outside of the watchcase 40 by the defects which form the decorative pattern 22, rendering this decorative pattern 22 perfectly visible.

Figure 6:
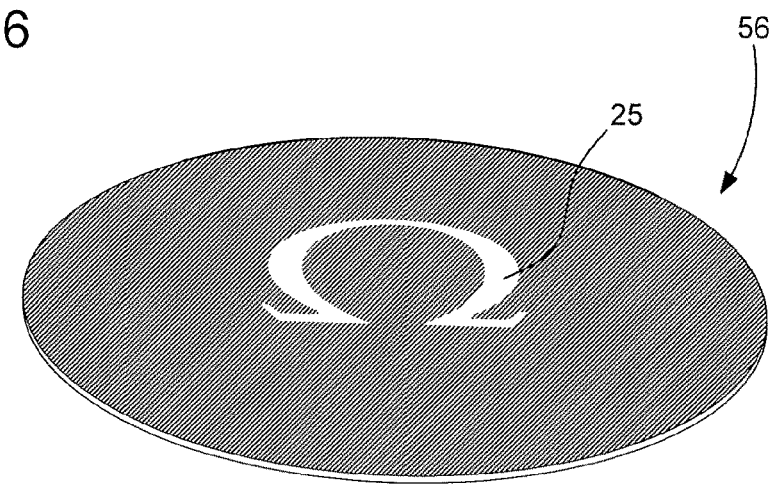
FIG. 6 illustrates a mask embodied in the form of a metal sheet in which an opening whose outline corresponds to the pattern to be structured has been cut.

FIG. 6 illustrates a mask embodied in the form of a metal sheet 56 in which has been cut an opening 25 the outline thereof corresponding to the decorative pattern 22 to be structured.

Figure 7A:
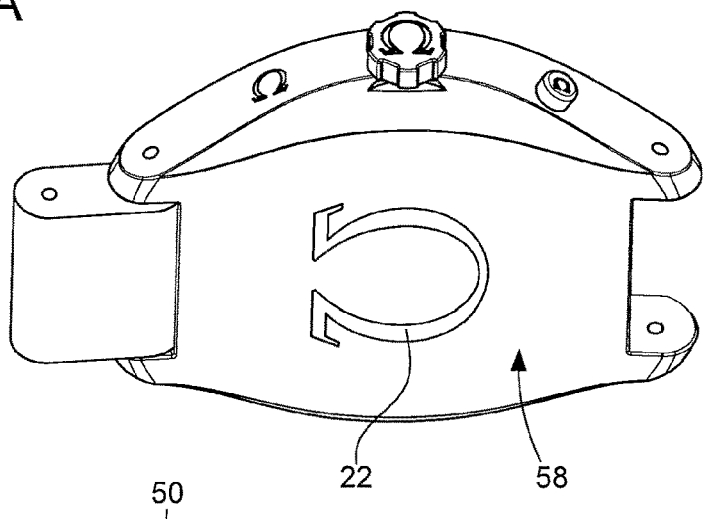
FIG. 7A is a bottom view of the watchcase represented in FIG. 4.

FIG. 7A is a bottom view of the watchcase 40 represented in FIG. 4. This watchcase 40 is closed by a back 58 made of an at least partially transparent crystalline, semi-crystalline or amorphous material in which is structured a decorative pattern 22 in accordance with the method according to the invention.

Figure 7B:
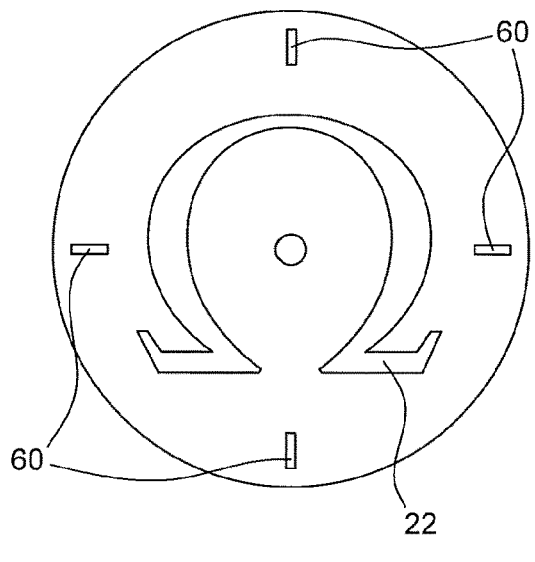
FIG. 7B is a top view of a watch dial in which have been structured a decorative pattern as well as hour indexes which form technical patterns.

FIG. 7B is a top view of the watch dial 50 in which has been structured a decorative pattern 22 in accordance with the method according to the invention. By applying the method according to the invention, in the dial 50 technical patterns 60 have also been structured, in this instance four hour indexes at twelve o'clock, three o'clock, six o'clock and nine o'clock.

Figure 7C:
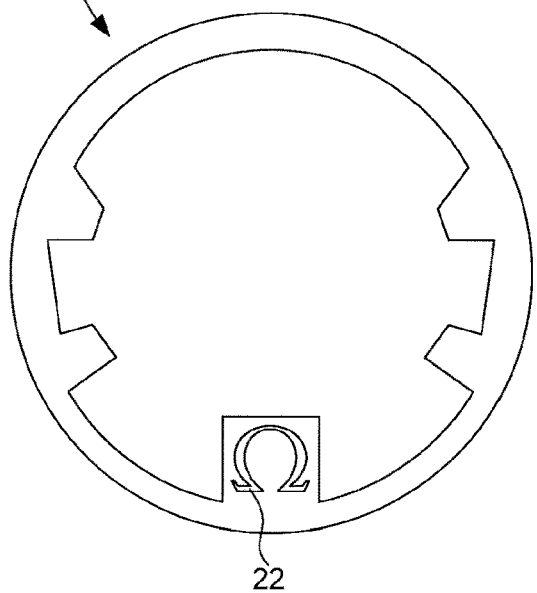
FIG. 7C is a representation of a bridge for a timepiece movement wherein a decorative pattern has been structured using the method according to the invention.

FIG. 7C is a representation of a bridge 62 for a timepiece movement wherein a decorative pattern 22 has been structured using the method according to the invention.

It is obvious that the present invention is not restricted to the embodiments described above, and that various modifications and simple alternative embodiments may be envisaged by those skilled in the art without leaving the scope of the invention as defined by the appended claims.

It shall be noted in particular that the mask may be presented in the form of a metal sheet in which the outline of the pattern to be structured has been cut, this metal sheet being subsequently fastened onto that of the surfaces of the object in which it is sought to structure the pattern. Similarly, the mask may also be made of ceramic. The mask may also be obtained by selective deposition such as ink-jet printing of a masking material at the positions where the mask is to cover that of the top and/or bottom surfaces wherein it is sought to structure the pattern. The mask may also be obtained by deposition of a layer of a masking material on the entirety of that of the top and/or bottom surfaces of the object in which it is sought to structure the pattern. This masking layer is subsequently ablated at the positions where it is sought to structure the pattern in the thickness of the object, for example by means of a laser beam. The mask may also be obtained by means of a layer of light-sensitive resin, for example sensitive to ultraviolet radiation, and be structured by means of a light source, for example ultraviolet. In any case, the mask must exhibit mechanical properties such that the ion beam does not succeed in etching the surface of the object made of an at least partially transparent material in which the pattern is to be structured at the positions where the object is covered by the mask.

The term transparent material denotes a material which, by allowing light to pass through readily, makes it possible to distinguish objects clearly through the thickness thereof.

The term object made of an at least partially transparent material denotes an object made of a block of material which has at least one transparent zone in which the technical or decorative pattern is to be structured in accordance with the method according to the invention, the other zones of the objects optionally being opaque.

The term glass denotes a non-crystalline solid which exhibits the vitreous transition phenomenon.

The at least partially transparent material of which the object in which the technical or decorative pattern is structured in accordance with the method according to the invention is made may be chosen from crystalline, semi-crystalline or amorphous. Of the crystalline materials which are well suited to the needs of the invention, mention may be made of sapphire, ruby or diamond. Using the natural form of these jewels may be envisaged, but it shall be understood that the use of synthetically obtained sapphire, ruby or diamond is more realistic in an industrial production context. In the field of amorphous materials, an example of material well suited to the needs of the invention is provided by mineral glass. Further examples of semi-crystalline or amorphous materials which are suitable for the implementation of the method according to the invention are provided by polypropylene homopolymer, polypropylene copolymer and polyethylene terephthalate which are semi-crystalline transparent thermoplastic materials, as well as by crystal polystyrene and polymethyl methacrylate which are amorphous thermoplastic materials.

REFERENCE LIST

1. ECR ion source
2. Injection stage
4. Gas volume to be ionised
6. Microwave
8. Magnetic confinement stage
10. Plasma
12. Extraction stage
12a. Anode
12b. Cathode
14. Ion beam
16. Glass
18a. Top surface
18b. Bottom surface
20. Edge
22. Decorative pattern
e. Thickness
24. Mask
25. Opening
26. Sapphire sample
28. Surface layer
30. First amorphous layer
32. Cavities
34. Second amorphous layer
36. Final layer
38. Volume
40. Watchcase
42. Bezel
44. Middle
46. Crown
47. Corrector
48. Link
50. Dial
52. Light source
54. Observer
56. Metal sheet
58. Back
60. Technical pattern
62. Bridge

The invention claimed is:

1. A method for structuring a decorative or technical pattern in a thickness of an object made of an at least partially transparent amorphous, semi-crystalline or crystalline material, wherein the object is made of an at least partially transparent material comprising a top surface and a bottom surface which extends away from the top surface, the method comprising:

providing at least one of the top or bottom surfaces of the object made of an at least partially transparent material with a mask which defines at least one opening whose outline corresponds to the profile of the decorative or technical pattern to be structured, wherein the mask covers the at least one top or bottom surface of the object made of an at least partially transparent material at positions which are not to be structured; and structuring the decorative or technical pattern in the thickness of the object with a mono- or multicharged ion beam through the at least one opening of the mask, the mechanical properties of the mask being sufficient to prevent the ions of the ion beam from etching the at least one top or bottom surface of the object made of an at least partially transparent material at the positions where this top or bottom surface is covered by the mask, wherein the object is glass made of sapphire and is comprised of successive layers of a top surface layer, a first amorphous layer having cavities with dimensions of the cavities decreasing in size in a depth direction of the first amorphous layer, a second amorphous layer devoid of cavities, a layer having a thickness of 50 to 60 nm, and a sapphire layer.

2. The method according to claim 1, wherein the mono- or multicharged ion beam is produced by a mono- or multicharged ion source of an ECR electron cyclotron resonance type.

3. The method according to claim 1, wherein the ion implantation dose is $0.5*10^{16}$ ions·cm$^{-2}$.

4. The method according to claim 1, wherein the ion implantation dose is $1*10^{17}$ ions·cm$^{-2}$.

5. The method according to claim 1, wherein the object is an element of a timepiece or of a piece of jewelry, and
wherein the ion implantation dose is between $1*10^{15}$ ions·cm$^{-2}$ and $10^{18}$ ions·cm$^{-2}$.

6. The method according to claim 1, wherein the mask is a sheet of material wherein said outline of the decorative or technical pattern has been cut, this sheet of material being subsequently fastened onto that of the top and/or bottom surfaces of the object wherein it is sought to structure the pattern.

7. The method according to claim 6, wherein the mask is made of metal or of ceramic.

8. The method according to claim 1, wherein the mask is obtained by selective deposition of a masking material at the positions where the mask is to cover that of the top and/or bottom surface at the positions where this top and/or bottom surface is not to be struck by the ion beam.

9. The method according to claim 8, wherein the mask is produced by ink-jet printing.

10. The method according to claim 1, wherein the mask is obtained by deposition of a layer of a masking material on that of the top and/or bottom surfaces whereon the mask is to be structured, followed by ablation of the masking layer at the positions where that of the top and/or bottom surface is to be structured.

11. The method according to claim 10, wherein the layer of masking material is ablated with a laser beam.

12. The method according to claim 10, wherein the masking material is an ultraviolet radiation-sensitive resin which is structured with a UV source.

* * * * *